(12) United States Patent
Stamper et al.

(10) Patent No.: US 11,574,863 B2
(45) Date of Patent: Feb. 7, 2023

(54) LOCAL INTERCONNECT LAYER WITH DEVICE WITHIN SECOND DIELECTRIC MATERIAL, AND RELATED METHODS

(71) Applicant: GLOBALFOUNDRIES U.S. Inc., Santa Clara, CA (US)

(72) Inventors: Anthony K. Stamper, Burlington, VT (US); Steven M. Shank, Jericho, VT (US); Venkata N. R. Vanukuru, Bangalore (IN)

(73) Assignee: GlobalFoundries U.S. Inc., Santa Clara, CA (US)

( * ) Notice: Subject to any disclaimer, the term of this patent is extended or adjusted under 35 U.S.C. 154(b) by 133 days.

(21) Appl. No.: 17/169,947

(22) Filed: Feb. 8, 2021

(65) Prior Publication Data

US 2022/0254715 A1 Aug. 11, 2022

(51) Int. Cl.
  *H01L 23/522* (2006.01)
  *H01L 21/768* (2006.01)
  *H01L 23/528* (2006.01)

(52) U.S. Cl.
  CPC .... *H01L 23/5226* (2013.01); *H01L 21/76802* (2013.01); *H01L 23/528* (2013.01); *H01L 23/5222* (2013.01)

(58) Field of Classification Search
  CPC .......... H01L 23/5226; H01L 21/76802; H01L 23/5222; H01L 23/528
  See application file for complete search history.

(56) References Cited

U.S. PATENT DOCUMENTS

| | | | |
|---|---|---|---|
| 7,125,790 B2 | 10/2006 | Low et al. | |
| 10,062,748 B1* | 8/2018 | Stamper | H01L 23/562 |
| 2020/0075669 A1* | 3/2020 | Chuang | H01L 43/02 |
| 2020/0135635 A1* | 4/2020 | Chen | H01L 45/16 |
| 2021/0091139 A1* | 3/2021 | Tseng | H01L 43/08 |
| 2021/0134883 A1* | 5/2021 | Dutta | H01L 23/522 |

* cited by examiner

*Primary Examiner* — Karen Kusumakar
(74) *Attorney, Agent, or Firm* — Anthony Canale; Hoffman Warnick LLC (57) ABSTRACT

Embodiments of the disclosure provide an integrated circuit (IC) structure, including a device layer including a device on a substrate. A local interconnect layer is over the device layer, and includes a first dielectric material over the substrate. The first dielectric material has a first effective dielectric constant. A second dielectric material is over the device and adjacent the first dielectric material. The second dielectric material has a second effective dielectric constant less than the first effective dielectric constant.

20 Claims, 7 Drawing Sheets

LOCAL INTERCONNECT LAYER WITH DEVICE WITHIN SECOND DIELECTRIC MATERIAL, AND RELATED METHODS

TECHNICAL FIELD

Embodiments of the disclosure relate generally to integrated circuits (ICs). More specifically, the disclosure relates to IC structures including a local interconnect (LI) layer with a device and conductor within a second dielectric material, and related methods to form the same.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, field effect transistors (FETs), bipolar junction transistors (BJTs) and capacitors. Circuit chips with millions of such devices are common.

In the case of devices that include several transistors, such as FETs, developments in device scaling have accompanied technical setbacks arising from the close proximity of device components. One variable in particular is parasitic capacitance, which arises when a transistor exhibits electrical capacitance across its two terminals when the device is powered off. Parasitic capacitance may decrease the gain of a circuit, and more generally may reduce electrical isolation between nearby transistors within a device layer. Conventional approaches to reduce parasitic capacitance in a transistor, such as guard rings, may not be feasible when such elements do not provide a hermetic seal over the device layer. Known dielectric materials for hermetically sealing a device may not be thermally conductive enough to suit some technical applications, e.g., amplifiers or switching circuits.

SUMMARY

Aspects of the disclosure provide an integrated circuit (IC) structure, including: a device layer including a device on a substrate; and a local interconnect layer over the device layer, the local interconnect layer including: a first dielectric material over the substrate, and having a first effective dielectric constant, and a second dielectric material over the device and adjacent the first dielectric material, the second dielectric material having a second effective dielectric constant less than the first effective dielectric constant.

Further aspects of the disclosure provide an integrated circuit (IC) structure, including: a device layer including a first device on a substrate, and a second device on the substrate horizontally distal to the first device; and a local interconnect layer over the device layer, the local interconnect layer including: a first dielectric material over the first device, and having a first effective dielectric constant, a first contact to the first device, and within the first dielectric material, a second dielectric material over the second device and adjacent the first dielectric material, the second dielectric material having a second effective dielectric constant less than the first effective dielectric constant, and a second contact to the second device, and within the second dielectric material.

Another aspect of the disclosure provides a method of forming an integrated circuit (IC) structure, the method including: forming a first dielectric material over a first device and a second device of a device layer, and alongside a conductor over the second device, wherein the first dielectric material has a first effective dielectric constant; forming an opening within a portion of the first dielectric material to expose the second device, wherein the first opening is alongside the conductor; and forming a second dielectric material within the opening, alongside the first dielectric material, and alongside the conductor, the second dielectric material having a second effective dielectric constant that is less than the first effective dielectric constant.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an integrated circuit (IC) structure, in which a local interconnect (LI) layer includes a device and conductor within a second, distinct dielectric material. The presence of a second dielectric material may reduce parasitic capacitance across transistors therein while they are in an "off" state. Other portions of the LI layer may include conventional dielectric materials over other transistors in the same device layer, e.g., to provide a hermetic seal in other locations. Embodiments of the disclosure may include a device layer with several devices, one being a "first device" and another being a "second device" that is horizontally distal to the first device. Such devices may be transistors (e.g., FETs), and/or capacitors, resistors, diodes, etc.

A first dielectric material of an LI layer is over the first device, and a second dielectric material of the LI is over the second device. The second dielectric material has a composition with an effective dielectric constant less than that of the first dielectric material. A conductor to the second device is within the second dielectric material, and electrically couples the second device to a metal wiring layer over the local interconnect layer. The second dielectric material may take the form of a dielectric pillar extending vertically through portions of the LI layer and one or more metal wiring layers thereover. In this case, the term "pillar" may refer to a wide variety of vertically-extending bodies, including shafts, bars, obelisks, etc., extending continuously or discontinuously through a defined space within the LI layer and/or metal wiring layer thereabove. In this case, the dielectric pillar may extend further above the device layer than the first dielectric material, and components such as portions of one or more devices and/or conductors may be within the dielectric pillar. During operation, the second dielectric material being over the second device reduces parasitic capacitance across the second device while it is powered off. Thus, the second device(s) may be integrated into amplifiers, electrical switches, and/or similar circuitry that is more likely to exhibit high parasitic capacitance, and the first device may be integrated into other types of circuitry.

Figure 1:
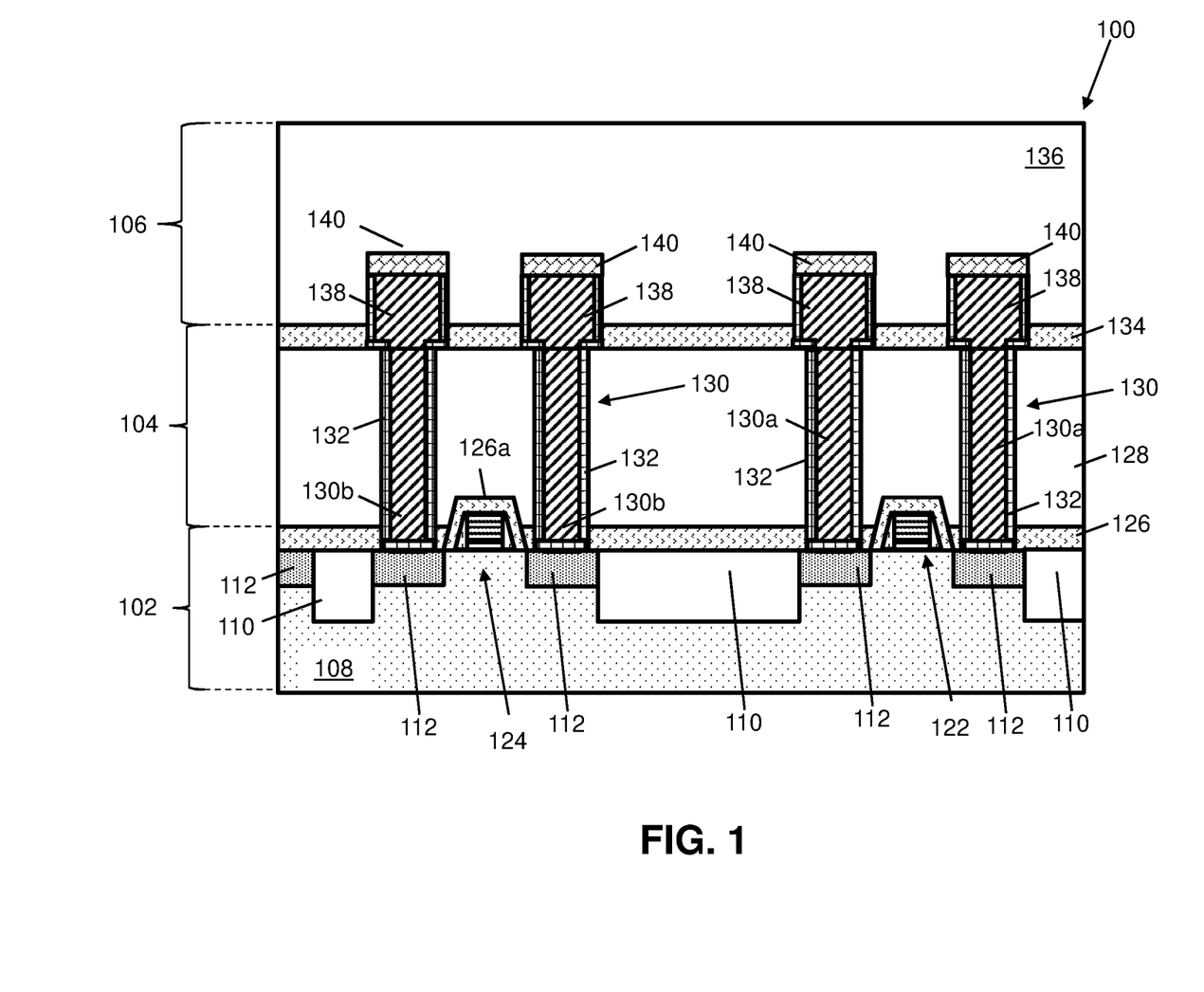
FIG. 1 shows a cross-sectional view of a device layer and local interconnect layer in an initial state according to embodiments of the disclosure.

Referring to FIG. 1, embodiments of the disclosure provide IC structures and methods to form the IC structures. FIG. 1 provides a preliminary structure 100 (simply "structure" hereafter), representing a partially-manufactured IC with a device layer 102 and a local interconnect (LI) layer 104 over device layer 102. A portion of a metal wiring layer 106 may be located over LI layer 104, and additional metal wiring layers may be formed over metal wiring layer 106 as described elsewhere herein. Device layer, LI layer 104, and metal wiring layer 106 may be formed substantially in accordance with conventional methods to form transistors and overlying conductors, such as metal wires and/or vias. Such methods are generally understood in the art and, apart from various techniques relevant to the disclosure, are not described in further detail herein. Device layer 102 of structure 100 may be formed on a substrate 108 including, e.g., one or more semiconductor materials. Substrate 108 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 108 or a portion thereof may be strained.

Insulative materials may be formed at various locations within substrate 108 to electrically separate active structures within device layer 102 from each other. For instance, as shown in FIG. 1, several shallow trench isolation regions 110 may be formed within substrate 108 to a predetermined depth. Any known method, such as forming trenches within substrate 108, depositing a dielectric insulator (e.g., oxide) and polishing the deposited dielectric material may be used to form isolation regions 110 to a predetermined depth.

Embodiments of the disclosure may include introducing dopants into substrate 108 at selective locations. Substrate 108 may include a light amount of doping, e.g., by being pre-doped at the time of manufacture or otherwise before isolation regions 110 are formed therein. Where applicable, substrate 108 may be pre-doped with p-type dopants or n-type dopants. With isolation regions 110 in place, various portions of substrate 108 may be doped (e.g., by being vertically implanted with dopant ions) to form a set of active semiconductor regions 112 within substrate 108. The dopants used to form active semiconductor regions 112 may substantially reduce the resistivity of semiconductor material(s) in substrate 108 where introduced. Some portions of substrate 108 and isolation regions 110 may be covered by a layer of photoresist material (not shown) at this stage to prevent non-targeted areas of substrate 108 from being doped. Portions of substrate 108 beneath isolation regions 110 and active semiconductor regions 112 may remain undoped or only lightly doped, and hence may substantially retain their doping as determined by the substrate 108. After active semiconductor regions 112 have been formed, any photoresist materials used to form active semiconductor regions 112 may be removed by way of ashing or any other photoresist strip method known in the art. In the example of forming transistors on substrate 108, each active semiconductor region 112 may define a source or drain region of a transistor in device layer 102.

Device layer 102 may include active components in the form of at least at least a first device 122 and a second device 124 on substrate 108 and within device layer 102. Each device 122, 124 may take the form of one or more active electrical elements, such as a field effect transistor (FET) or NPN transistor above and/or coupled to active semiconductor regions 112 as known in the art. Devices 122, 124 are illustrated by example in the accompanying drawings as being FETs, with some subcomponents above active semiconductor region(s) 112, but this is not required in all instances. As discussed herein, first device 122 and/or second device 124 may take the form of a transistor or other active element to be coupled to, and/or isolated from, other devices and/or elements located elsewhere within structure 100.

According to various examples, devices 122, 124 may take the form of a bipolar junction transistor (BJT), a metal oxide semiconductor (MOS) field effect transistor (MOSFET), a lightly doped drain MOS (LDMOS), a diode, a capacitor, or any active or passive device as known in the art. Devices 122, 124 in further embodiments may include, e.g., one or more capacitors, resistors, inductors, diodes, etc., for implementing various electrical functions. In any case, devices 122, 124 may be horizontally distal to each other across substrate 108, and/or separated by isolation region(s) 110. As used herein, the term "horizontally distal" refers to one element being horizontally displaced from another, and separated from the other element by at least one other intervening element. In this case, devices 122, 124 may be horizontally distal to each other because portions of substrate 108, isolation region(s) 110, and/or active semiconductor regions 112 horizontally separate devices 122, 124 from each other.

Embodiments of the disclosure may include the forming of structure 100 to include first device 122 and second device 124 in active layer 102, substantially in accordance with conventional methodologies before further processing of structure 100, as described herein. Such methodologies may include the forming of LI layer 104. LI layer 104 of preliminary structure 100 may include, e.g., a barrier film 126 for vertically isolating overlying materials from device layer 102 thereunder. Barrier film 126 may include one or more electrically insulative materials with a particularly high resistance to etching. Barrier film 126 more specifically may be formed as an "etch stop layer," configured to prevent underlying device components from being removed or modified in subsequent processing. Barrier film 126 thus may include, e.g., a nitrogen-doped silicon carbide (SiCN) layer, or other material with similar properties. Barrier film 126 may be formed after the forming and processing of device layer 102 concludes. Barrier film 126 may also be formed on the upper surface and sidewalls 126A of first device 122 and second device 124, in cases where conformal deposition is used. With barrier film 126 in place, continued processing may form additional conductive and insulative subportions of LI layer 104 and metal wiring layer 106.

Etching generally refers to the removal of material from a substrate (or structures formed on the substrate), and is often performed with patterned materials (e.g., one or more masks) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features suitable to create similar elements, e.g., openings at targeted locations, as discussed herein with respect to other drawings and more generally with respect to various elements in structure 100.

LI layer 104 additionally may include a first dielectric material 128, e.g., one or more oxide-based dielectric materials suitable to physically and electrically separate respective regions of conductive material in LI layer 104. Other types of oxide-based or nitride-based dielectric materials may also be appropriate for distinguishing from other dielectric materials, as discussed elsewhere herein. First dielectric material 128 may include but is not limited to: silicon dioxide-based dielectrics such as $SiO_2$; doped oxides such as phosphsilicate glass (PSG), borophosphsilicate glass (BPSG); fluorinated silicate glass (FSG); or oxides containing carbon, such as SiCOH. Spin-in or CVD formed dielectric materials additionally or alternatively can be used. Regardless of the material(s) included therein, first dielectric material 128 may have a first effective dielectric constant that is higher than other subsequently-formed dielectric material(s) within LI layer 104. Some portions of first dielectric material 128 may be replaced with such materials, as discussed elsewhere herein. In an example setting, first dielectric material 128 may have an effective dielectric constant between approximately three and four. The composition of first dielectric material 128 may be chosen to hermetically seal first device 122 thereunder. In such an example, first dielectric material 128 may include BPSG and/or similar materials and would have an effective dielectric constant of approximately four.

Portions of LI layer 104 may include conductors in the form of contacts 130 (e.g., four of such contacts being shown in FIG. 1) for electrically coupling portions of device(s) 122, 124 to other wiring levels located above LI layer 104. Contacts 130 may include a set of first contacts 130a to active semiconductor regions 112 of first device 122, and a set of second contacts 130b to active semiconductor regions 112 of second device 124. Contacts 130 may include any currently known or later developed conductive substance capable of forming a conductive pathway between multiple electrically active elements. As examples, contacts 130 may include any and/or all conductive materials such as copper (Cu), aluminum (Al), tungsten (W), cobalt (Co), titanium (Ti), etc. First contacts 130a and second contacts 130b thus may be structurally or compositionally indistinct, except with regard to the device(s) 122, 124 to which they are coupled. Each contact 130 may include a barrier liner 132 on its sidewalls, adjacent dielectric material 128.

Barrier liner 132 may include any now known or later developed barrier liner material (e.g., refractory metal liner) including but not limited to: tantalum nitride (TaN) and tantalum; tantalum nitride, tantalum and cobalt; and magnesium (Mn), or combinations thereof. Similar liners may also formed on sidewalls of other conductive materials described herein. Contact(s) 130 may be formed, e.g., by deposition of conductive materials within trenches in first dielectric material 128. Such trenches within first dielectric material 128 may be formed by forming a mask (not shown) on first dielectric material 128 to form openings where contact(s) 130 are desired. Barrier liners 132 may be formed within first dielectric material 128 on exposed surfaces and sidewalls within the formed openings. Where applicable, portions of barrier liner 132 may be removed (e.g., by selective etch) to expose active semiconductor material(s) 112 thereunder for siliciding and/or forming of contact(s) 130 thereon.

The vertical conductive material of contacts 130 may be formed, e.g., by deposition after barrier liners 132 are in place. First contacts 130a may be formed together with second contacts 130b, or separately. Forming a material by "depositing" or "deposition" generally may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

To vertically separate LI layer 104 from metal wiring layers formed thereon and provide an etch stop layer for the damascene wires formed in layer 106, an additional dielectric barrier film 134 may be formed on the upper surfaces of first dielectric material 128 and contacts 130. Additional barrier film 134 may include the same material as barrier film 126 (e.g., a nitride-based layer, etch stop layer, etc., such as SiN, SiC, or SiCN), and/or may include a different material with similar properties. In some cases, additional barrier film 134 may be omitted. In cases where additional barrier film 134 is formed, some portions of metal wiring layer 106 may be formed on additional barrier film 134.

Structure 100 may include some portions of metal wiring layer 106 on device layer 102 and/or LI layer 104, while additional portions of metal wiring layer 106 may be formed in subsequent processing phases as discussed herein. Thus, embodiments of the disclosure may be implemented before, during, or after the formation of metal wiring layer 106 on LI layer 104. According to an example, the forming of metal wiring layer 106 may include forming an inter-level dielectric (ILD) material 136 above LI layer 104, and in particular on additional barrier film 134. ILD material 136 may have the same material composition as first dielectric material 128, and/or may include any other conceivable dielectric material such as a low-k dielectric material. ILD material 136 may have a thickness sufficient to electrically separate conductive materials within metal wiring layer 106 from device layer 102 and LI layer 104 when such conductive materials are not coupled to corresponding elements in layer(s) 102, 104. The size and composition of ILD material 136 may also be selected to physically and electrically separate conductive materials within metal wiring layer 106 from overlying conductive materials.

Metal wiring layer 106 may be formed to include additional conductive materials for joining portions of device layer 102 to other metal wiring levels and/or other materials within device layer 102. For example, metal wiring layer 106 may include a set of metal wires 138 above LI layer 104. Metal wires 138 may include tungsten (W), or alternatively, other refractory and/or any other currently known or later developed material suitable for use as a capacitor electrode, e.g., aluminum (Al), tantalum (Ta), silver (Ag), etc. Metal wires 138 may include additional portions of barrier liner 132, and such portions may also be formed on portions of additional barrier film 134, ILD material 136, etc., before metal wire 138 formation to serve the same function as described relative to contact(s) 130. Although metal wires 138 are shown by example to be located below the top of ILD material 136, metal wire(s) 138 may extend laterally into or out of the plane of the cross-sectional view shown in FIG. 1. In some cases, a diffusion barrier 140 may be formed on metal wire(s) 138. Diffusion barrier 140 may protect metal wire(s) 138 from diffusion of overlying metal (e.g., via) material into metal wire 138, and in some cases, also to prevent vertical modifying (e.g., etching) of metal wire(s) 138 in subsequent processing. In this case, diffusion barrier 140 may include cobalt tungsten phosphide (CoWP), or any currently known or later developed diffusion-blocking materials. Forming of additional wires, vias, etc., within metal wiring layer 106 may be implemented after further processing of layer(s) 102, 104, 106, as discussed herein.

Figure 2:
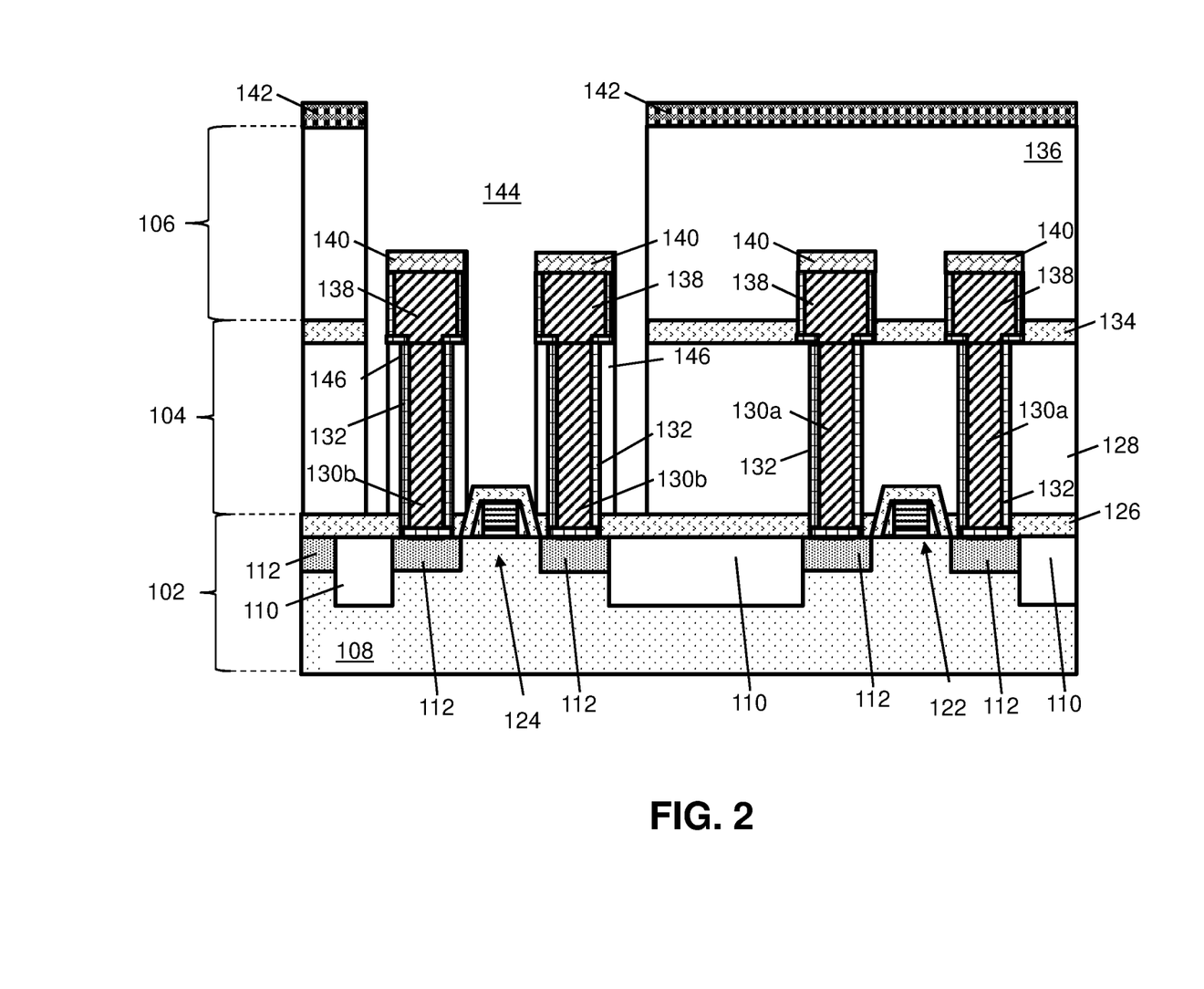
FIG. 2 shows a cross-sectional view of forming an opening within a portion of a first dielectric material according to embodiments of the disclosure.

Turning to FIG. 2, embodiments of the disclosure include removing portions of first and second dielectric materials 128, 136 at selected locations. For instance, second device 124 may be part of a circuit where overlying dielectric materials of a second, relatively low effective dielectric constant may improve its underlying functions. In this case, portions of first and second dielectric materials 128, 136 over second device 124 may be targeted for replacement with other, distinct dielectric materials. First device 122, by contrast, may be structured for use with first dielectric material 128. Embodiments of the disclosure may allow first dielectric material 128 to be replaced with other materials over second device 124, while remaining intact over first device 122. In some embodiments, first dielectric layer 128 is removed prior to the formation of second dielectric layer 136.

Methods according to the disclosure may include removing selected portions of first dielectric material 128, as well as additional barrier film 134 and ILD material 136 thereover, for replacement with another dielectric material. Reactive ion etching (RIE) of ILD material 138 with a mask 142 is one technique suitable to form an opening 144. Opening 144 may expose second device 124 of device layer 102 thus forming vacant space where replacement dielectric material for use over second device 124 may be formed. Mask 142 thus may be structured such that opening 144 is at least partially over, and thus substantially vertically aligned with, second device 124. Mask 142 additionally may be shaped to prevent opening 144 from being formed over first device 122. A remaining portion of first dielectric material 128 beneath metal wire(s) 138, and alongside barrier liner 132 and/or second contact(s) 130b, may remain intact as a dielectric liner 146. Dielectric liner 146 may have a higher effective dielectric constant than subsequent dielectric materials formed within opening 144, and may remain intact as a result of forming opening 144 by way of RIE or other vertical etching technique(s). Dielectric liner 146 may be removed during the etch. In one embodiment, dielectric liner 146 is removed using a wet etch, such as HF acid.

Figure 3:
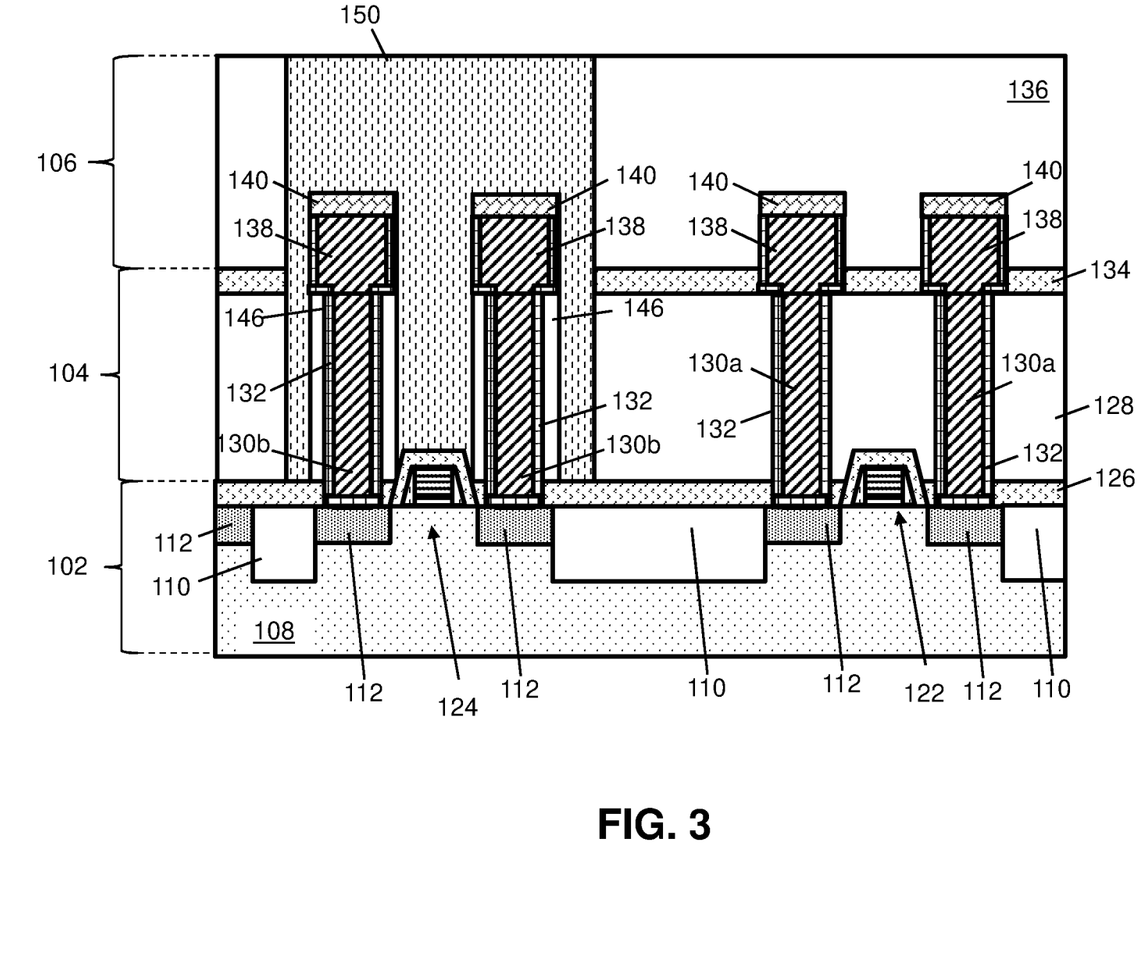
FIG. 3 shows a cross-sectional view of forming a second dielectric material according to embodiments of the disclosure.

FIG. 3 depicts forming a second dielectric material e.g., any dielectric material having a second effective dielectric constant that is less than that of first dielectric material 128 or first and second dielectric materials 128, 136. Second dielectric material 150 may include any of several oxide-based or nitride-based dielectric materials, and in particular may include materials exhibiting an effective dielectric constant less than that of BPSG, $SiO_2$, and/or similar materials. Such materials may include, e.g., SiCOH insulators, carbon doped oxides, spin on polymers, and/or other materials with similar properties. In an example setting, the second effective dielectric constant of dielectric fill may be at most approximately three. Second dielectric material 150 may be formed within opening by deposition and subsequent planarization, such that the top of second dielectric material 150 covers adjacent portions of ILD material 136. The planarizing of second dielectric material 150 may be implemented through chemical mechanical planarization (CMP) or other techniques (e.g., various types of controlled etching such as reverse mask etchback) for removing portions of dielectric material to a desired depth.

Second dielectric material 150 may extend vertically continuously from second device 124 to above diffusion barrier 140. Thus, second dielectric material 150 may be located partially within LI layer 104 and metal wiring layer 106, thus being horizontally adjacent first dielectric material 128 and ILD material 136. Additionally, conductors such as contacts 130 (e.g., second contact(s) 130b) and/or metal wires 138 may be positioned within second dielectric material 150. Second dielectric material 150 thus may take the form of a vertically-extending dielectric pillar extending through LI layer 104 and metal wiring layer 106. Where second dielectric material 150 takes the form of a dielectric pillar, it may be horizontally adjacent to each of first dielectric material 128, barrier film 134, and ILD material 136. The prior targeted etching of first dielectric material 128 and additional barrier film 134 may allow second dielectric material 150 to extend vertically through LI layer 104 and metal wiring layer 106. Additional barrier film 134 thus may not be present within second dielectric material 150, and may not be over second device 124.

Figure 4:
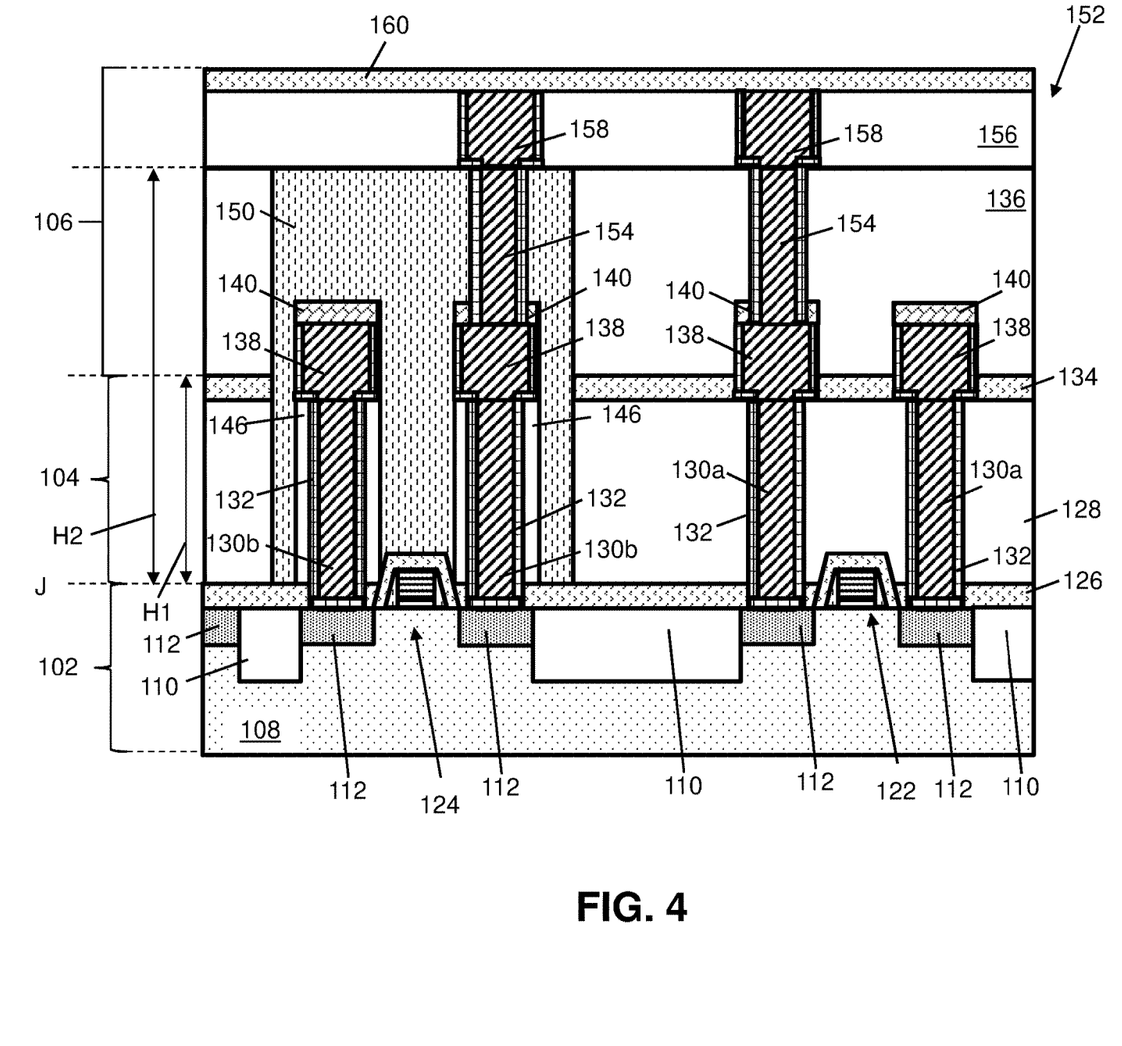
FIG. 4 shows a cross-sectional view of forming a metal wiring layer over the local interconnect layer according to embodiments of the disclosure.

FIG. 4 depicts further processing to form additional portions of metal wiring layer 106, thus yielding an IC structure 152 according to embodiments of the disclosure. First dielectric material 128 may have a height H1 above upper surface J of device layer 102 that is substantially less than height H2 of second dielectric material 150 over upper surface J of device layer 102. In some implementations, height H2 may be approximately twice the size of height H1. In a further example, the difference between height H1 and height H2 may be approximately one micron. Thus, metal wiring layer 106 may include portions of second dielectric material 150, while also including ILD material 136. The additional portions of metal wiring layer 106 shown in FIG. 5 may be formed after the processing of second dielectric material 150 concludes, and substantially in accordance with known techniques to form such layers. For example, selected portions of ILD material 136 and/or second dielectric material 150 may be removed to form openings, and filled with conductive material to yield a set of vias 154.

Vias 154 may be formed of any conductive material, and thus may have the same composition as contact(s) 130, metal wire(s) 138 thereunder. Via(s) 154 may be formed with additional regions of barrier liner 132 on their sidewalls, as noted elsewhere herein. Via(s) 154 optionally may be formed within ILD material 136 over first device 122, and within second dielectric material 150 over second device 124, before portions of first dielectric material 128 and ILD material over second device 124 are replaced with second dielectric material 150.

Continued processing of metal wiring layer 106 may include, e.g., forming a layer of additional ILD material 156 over ILD material 136 to a desired height. Although additional ILD material 156 is indicated for explanation as being different from ILD material 136, additional ILD material 156 may have the same composition as ILD material 136. In some implementations, there may not be a visibly detectable physical interface between ILD materials 136, 156. The thickness of additional ILD material 156 over ILD material 136 may be sufficient for a set of additional metal wires 158 to be formed within additional ILD material 156. In this case, portions of additional ILD material 156 may be removed and replaced with additional metal wires 158 and barrier liner(s) 132 in substantially the same manner as metal wire(s) 138 are formed within ILD material 136. Regardless of whether additional ILD material 156 and/or additional metal wire(S) 158 are formed, an overlying barrier film 160 may be formed over the top surface of metal wiring layer 106 to physically and electrically isolate components within metal wiring layer 106 from overlying layers or elements. Overlying barrier film 160 may have the same composition as barrier film 126 and/or additional barrier film 134 (e.g., silicon nitride), and/or may feature other insulative or etch-resistant compositions (e.g., nitrogen-doped silicon carbide).

Figure 5:
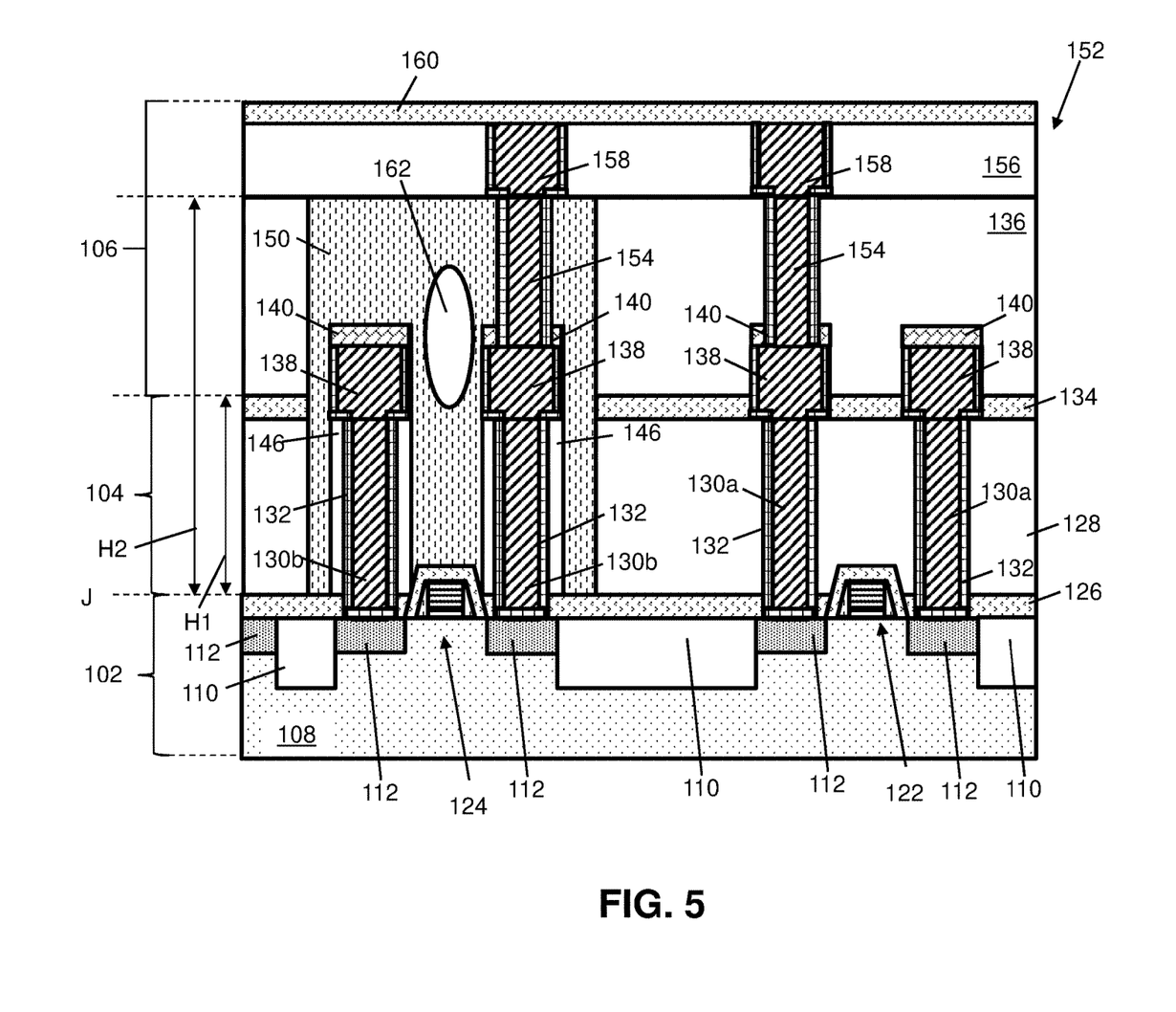
FIG. 5 shows a cross-sectional view of an IC structure with a gas dielectric region within the local interconnect layer according to embodiments of the disclosure.

FIG. 5 depicts further implementations of IC structure 152, in which second dielectric material 150 includes an airgap or a gas dielectric region 162. In this case, the structure and processing of IC structure 152 may be substantially the same as other implementations described herein, apart from the techniques used to form second dielectric material 150. Gas dielectric region 162 may be formed by way of any currently known or later developed technique for dielectric air gap integration. Such techniques may include, e.g., forming one or more sacrificial evaporable materials within second dielectric material 150, and subsequently evaporating the sacrificial material(s) through pores in second dielectric material 150. In further examples, gas dielectric region 162 may refer to inherent porous regions in cases where second dielectric material 150 includes a porous dielectric material (e.g., SiCOH).

Figure 6:
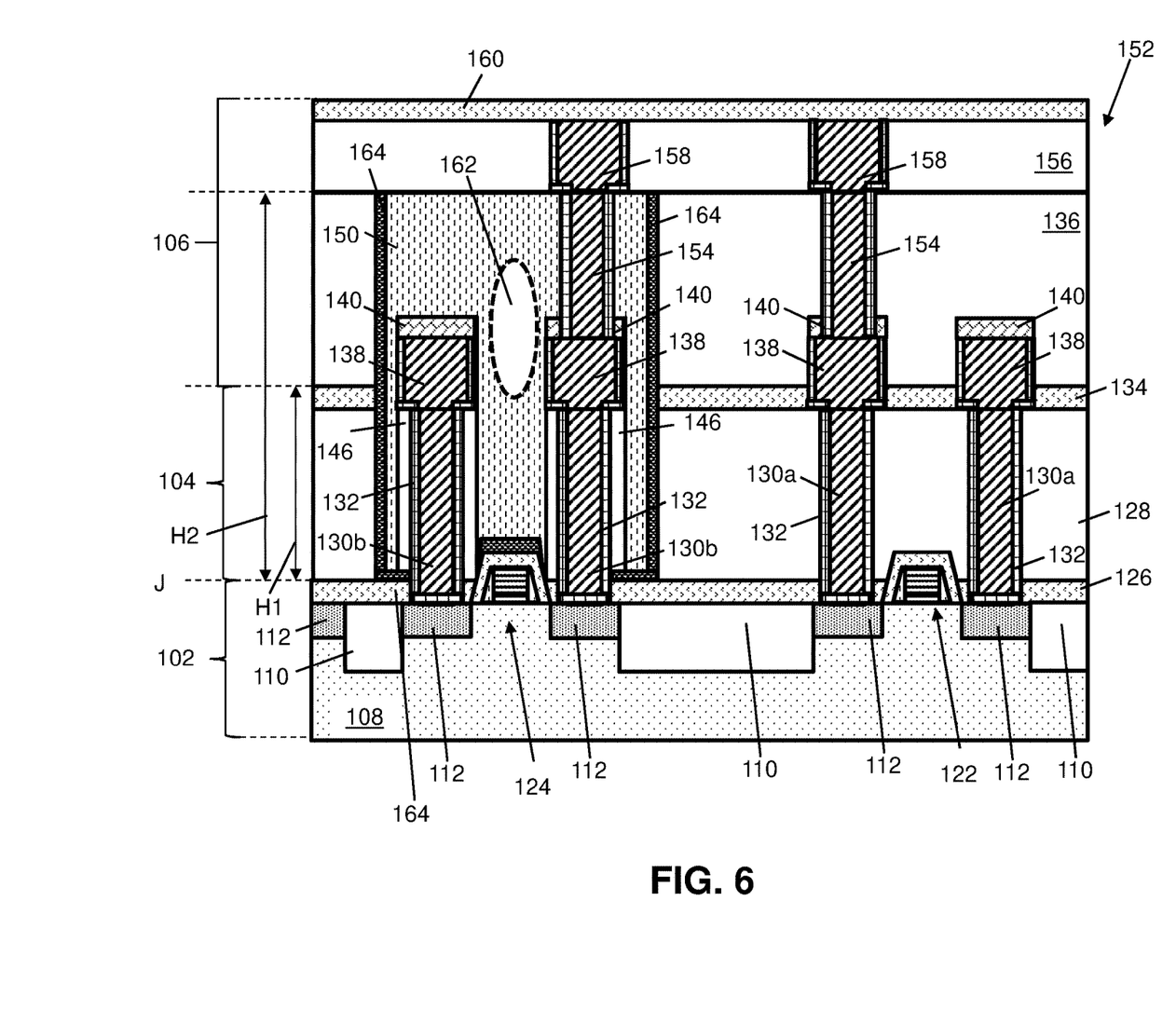
FIG. 6 shows a cross-sectional view of an IC structure with a nitride liner between the first dielectric material and second dielectric material according to embodiments of the disclosure.

FIG. 6 depicts further optional features of IC structure 152, in which a set of nitride liners 164 may be formed alongside second dielectric material 150. Gas dielectric region 162 is illustrated with dashed lines, to indicate that it may also be used in further implementations. To form nitride liners 164, portions of barrier film 126 over second device 124 may be removed, and thereafter replaced with nitride liners 164 in the same position before second dielectric material 150 are formed. Nitride liners 164 may be formed by conformal deposition. In this case, portions of nitride liner may be horizontally adjacent first dielectric material 128, additional barrier film 134, and/or ILD material 136. The forming of nitride liners 164 may help to thermally and electrically isolate second device 124, and second dielectric material 150 thereover, from first device 122 and first dielectric material 128.

Figure 7:
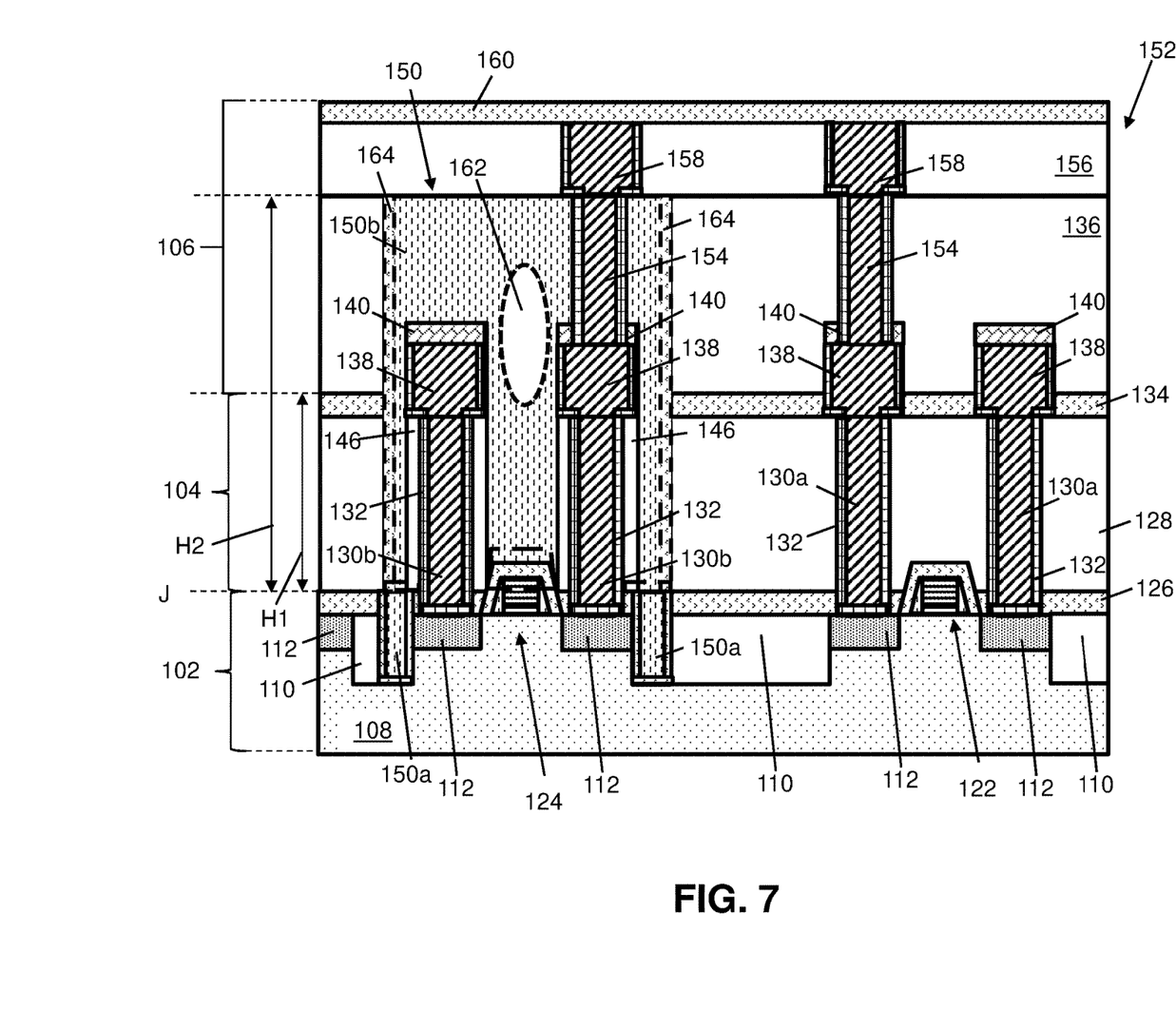
FIG. 7 shows a cross-sectional view of an IC structure with a portion of the second dielectric material within the device layer according to embodiments of the disclosure.

FIG. 7 depicts an IC structure 152 in which an alternative configuration of second dielectric material 150 protrudes vertically into device layer 102. Gas dielectric region 162 and nitride liners 164 are shown with dashed lines in FIG. 7, to indicate that such elements optionally may be used in such an implementation. In this case, portions of isolation region(s) 110 and/or substrate 108 may be removed to form openings when portions of first dielectric material 128 are removed from locations over second device 122. The openings then may be filled with second dielectric material 150 as discussed elsewhere herein. As a result, second dielectric material 150 optionally may include a first portion 150a within device layer 102, and below a bottom surface J of first dielectric material 128. A second portion 150b of second dielectric material may be horizontally adjacent first dielectric material 128, and optionally may be horizontally separated from first dielectric material 128 by nitride liner 164, as described herein. The presence of first portion 150a alongside second device 124 allows, e.g., greater thermal conductivity near second device 124 in cases where second dielectric material 150 has a higher thermal conductivity than first dielectric material 128. Higher thermal conductivity may be preferable, e.g., where second device 124 forms part of a power amplification circuit.

Embodiments of the disclosure provide various technical and commercial advantages, and some examples of such advantages are discussed herein. Embodiments of the disclosure allow conventional dielectric materials to hermetically seal selected active components in device layer 102 (e.g., first device 122), while allowing other active components (e.g., second device 124) to be surrounded by distinct dielectric materials having a lower dielectric constant and/or higher thermal conductivity. The ability to form second dielectric material 150 before or during the forming of metal wiring layer 106 allows for multiple dielectric materials 128, 150 to be integrated into one fabrication process. Additionally, some portions of first dielectric material 128 may be intentionally left intact alongside contact(s) 130 as dielectric liner(s) 146, to provide stronger electrical isolation at some locations despite the presence of second dielectric material(s) 150 with a lower effective dielectric constant. These and other technical aspects of the present disclosure allow different types of devices with varying technical concerns to be formed in close proximity on a single substrate, e.g., low noise power amplifiers and/or switching circuits can be formed near other types of devices.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a device layer including a device on a substrate, wherein the device includes a first end opposite a second end; and
   a local interconnect layer over the device layer, the local interconnect layer including:
      a first dielectric material over the substrate; and having a first effective dielectric constant, and
      a second dielectric material over the device and adjacent the first dielectric material, the second dielectric material having a second effective dielectric constant less than the first effective dielectric constant,
      wherein the second dielectric material includes a first portion and a second portion, the first portion extending to a depth within the substrate and alongside the first end and the second end of the device, and the second portion being a dielectric pillar.

2. The IC structure of claim 1, further comprising a dielectric liner horizontally between a conductor and the second dielectric material,
   wherein the conductor is within the second portion of the second dielectric material and connected to the device, and
   wherein the dielectric liner the first dielectric material have a same material composition.

3. The IC structure of claim 1, wherein the second effective dielectric constant is approximately three.

4. The IC structure of claim 3, wherein the first effective dielectric constant is between approximately three and approximately four.

5. The IC structure of claim 1, further comprising:
   a conductor in the second dielectric material and connected to the device; and
   a diffusion barrier on the conductor, and within the second portion of the second dielectric material.

6. The IC structure of claim 1, further comprising a gas dielectric region within the second portion of the second dielectric material.

7. The IC structure of claim 1, further comprising a nitride liner horizontally between the first dielectric material and the second portion of the second dielectric material.

8. The IC structure of claim 1,
   wherein the second portion is horizontally adjacent the first dielectric material.

9. The IC structure of claim 1, wherein a height of the second dielectric material over the device is greater than a height of the first dielectric material over the substrate.

10. The IC structure of claim 1, further comprising a metal wiring layer over the local interconnect layer, the metal wiring layer including:
    a conductor to the device and within the second portion of the second dielectric material;
    a via over the conductor, and within the second portion of the second dielectric material; and
    a metal wire over the via, and within a portion of the first dielectric material that is above the second dielectric material, wherein the conductor electrically couples the device to a metal wire over the local interconnect layer.

11. An integrated circuit (IC) structure, comprising:
a device layer including a first device on a substrate, and a second device on the substrate horizontally distal to the first device; and
a local interconnect layer over the device layer, the local interconnect layer including:
a first dielectric material over the first device, and having a first effective dielectric constant,
a first contact to the first device, and within the first dielectric material,
a second dielectric material over the second device and adjacent the first dielectric material, the second dielectric material having a second effective dielectric constant less than the first effective dielectric constant,
a gas dielectric region within the second dielectric material wherein the first dielectric material defines a hermetic seal over the first device, and
a second contact to the second device, and within the second dielectric material.

12. The IC structure of claim 11, wherein the first dielectric material includes a silicon dioxide (SiO$_2$) based insulator alongside the first contact.

13. The IC structure of claim 12, wherein the second dielectric material includes a SiCOH insulator.

14. The IC structure of claim 11, wherein a height of the second dielectric material over the second device is greater than a height of the first dielectric material over the first device.

15. The IC structure of claim 10, wherein the second portion of the dielectric material is at least partially within the local interconnect layer and the metal wiring layer.

16. A method of forming an integrated circuit (IC) structure, the method comprising:
forming a first dielectric material over a first device and a second device of a device layer, and alongside a conductor over the second device, wherein the first dielectric material has a first effective dielectric constant;
forming an opening within a portion of the first dielectric material to expose the second device, wherein the first opening is alongside the conductor; and
forming a second dielectric mated al within the opening, alongside the first dielectric material; and alongside the conductor, the second dielectric material having a second effective dielectric constant that is less than the first effective dielectric constant.

17. The method of claim 16, further comprising forming a gas dielectric region within the second dielectric material.

18. The method of claim 16, further comprising forming a nitride liner horizontally between the first dielectric material and the second dielectric material.

19. The method of claim 16, wherein forming the first dielectric material hermetically seals the first device.

20. The method of claim 16, forming the second dielectric material within the opening includes forming the second dielectric material to have a height above the second device that is greater than a height of the first dielectric material above the first device.

* * * * *